(12) United States Patent
Beaudoin et al.

(10) Patent No.: US 12,222,390 B2
(45) Date of Patent: Feb. 11, 2025

(54) FAULT TOLERANT SYNCHRONIZER

(71) Applicant: TEXAS INSTRUMENTS INCORPORATED, Dallas, TX (US)

(72) Inventors: Denis Roland Beaudoin, Rowlett, TX (US); Samuel Paul Visalli, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/457,537

(22) Filed: Aug. 29, 2023

(65) Prior Publication Data
US 2023/0400512 A1 Dec. 14, 2023

Related U.S. Application Data

(63) Continuation of application No. 17/573,683, filed on Jan. 12, 2022, now Pat. No. 11,796,592, which is a continuation of application No. 16/152,531, filed on Oct. 5, 2018, now Pat. No. 11,255,905.

(51) Int. Cl.
| | | |
|---|---|---|
| G01R 31/317 | (2006.01) | |
| G01R 31/3177 | (2006.01) | |
| H03K 3/037 | (2006.01) | |
| H03K 19/21 | (2006.01) | |

(52) U.S. Cl.
CPC . *G01R 31/31726* (2013.01); *G01R 31/31703* (2013.01); *G01R 31/3177* (2013.01); *H03K 3/037* (2013.01); *H03K 19/21* (2013.01)

(58) Field of Classification Search
CPC ........ G01R 31/31726; G01R 31/31703; G01R 31/3177; H03K 3/037; H03K 19/21; H03K 19/0033
See application file for complete search history.

(56) References Cited

U.S. PATENT DOCUMENTS

| | | |
|---|---|---|
| 5,224,129 A | 6/1993 | Lueker et al. |
| 6,366,174 B1 | 4/2002 | Berry et al. |
| 6,662,305 B1 | 12/2003 | Salmon et al. |
| 7,007,186 B1 | 2/2006 | Li |
| 7,330,489 B1 | 2/2008 | Benning |
| 7,394,884 B2 * | 7/2008 | Kaylani .................. H03L 7/081 711/149 |
| 8,161,441 B2 | 4/2012 | Wang |
| 8,365,049 B2 | 1/2013 | Pribbernow |

(Continued)

OTHER PUBLICATIONS

I. W. Jones, S. Yang and M. Greenstreet, "Synchronizer Behavior and Analysis," 2009 15th IEEE Symposium on Asynchronous Circuits and Systems, Chapel Hill, NC, USA, 2009, pp. 117-126 (Year: 2009).*

*Primary Examiner* — Cynthia Britt
(74) *Attorney, Agent, or Firm* — Michael T. Gabrik; Frank D. Cimino

(57) ABSTRACT

A synchronization circuit includes a first synchronizer having a first data input, a first clock input, and first output; a second synchronizer having a second data input, a second clock input, and a second output; selection circuitry having first, second, third and fourth inputs, and a synchronized data output, the first and second inputs coupled to the first and second outputs, respectively; and storage circuitry having a storage data input coupled to the synchronized data output, a third clock input, and a feedback output coupled to the fourth input.

18 Claims, 4 Drawing Sheets

(56) References Cited

U.S. PATENT DOCUMENTS

| | | | |
|---|---|---|---|
| 2004/0124899 A1* | 7/2004 | Cavazos | H03K 3/0375 |
| | | | 327/199 |
| 2006/0198479 A1 | 9/2006 | Hsu | |
| 2007/0025175 A1* | 2/2007 | Liu | G11C 7/1012 |
| | | | 365/233.11 |
| 2015/0188649 A1 | 7/2015 | Buckler | |
| 2018/0143247 A1* | 5/2018 | Lundberg | H03K 19/20 |
| 2023/0400512 A1* | 12/2023 | Beaudoin | H03K 19/21 |

* cited by examiner

FAULT TOLERANT SYNCHRONIZER

CROSS REFERENCE TO RELATED APPLICATIONS

This application is a continuation of, and claims priority to, U.S. patent application Ser. No. 17/573,683, filed Jan. 12, 2022, which is a continuation of, and claims priority to, U.S. patent application Ser. No. 16/152,531, filed Oct. 5, 2018 (now U.S. Pat. No. 11,255,905), each of which is incorporated by reference herein in its entirety.

BACKGROUND

It is often necessary for a digital system operating in one clock domain to communicate with another digital system that operates in different clock domain. When such communication is necessary, signals passed between the systems are resynchronized to clock timing of the receiving system. Synchronizer circuits disposed at the boundaries of the digital systems provide the synchronization.

SUMMARY

A synchronizer circuit that detects and compensates for soft errors is disclosed herein. Also disclosed is a circuit, such as a toggle occupancy circuit, that includes one or more instances of a synchronizer circuit.

In an example, a synchronization circuit includes a first synchronizer having a first data input, a first clock input, and first output; a second synchronizer having a second data input, a second clock input, and a second output; selection circuitry having first, second, third and fourth inputs, and a synchronized data output, the first and second inputs coupled to the first and second outputs, respectively; and storage circuitry having a storage data input coupled to the synchronized data output, a third clock input, and a feedback output coupled to the fourth input.

In another example, a circuit includes source circuitry; first flip-flop circuitry having a first input and a first output, the first input coupled to the source circuitry; destination circuitry; second flip-flop circuitry having a second input and a second output, the second input coupled to the destination circuitry; and synchronization circuitry having third and fourth inputs and third and fourth outputs, the third input coupled to the first output, the fourth input coupled to the second output, the third output coupled to the destination circuitry, and the fourth output coupled to the source circuitry.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Synchronizer circuits employ flip-flops to synchronize an asynchronous input signal to a system clock. As device geometry shrinks, flip-flops become more susceptible to soft errors caused by cosmic radiation, power supply noise, or other external events. Smaller device geometries also allow for an increase in device density with a corresponding increase in asynchronous clocking. Soft errors in asynchronous clocking circuitry can produce a variety of faults in a system. In the past, the limited nature of asynchronous clocking allowed soft errors in synchronization flip-flops to be ignored, but as device geometries shrink, the errors in synchronization become more significant, especially in safety critical applications that require protection from soft errors.

The synchronization circuit disclosed herein detects soft errors in synchronization flip-flops and allows a synchronizer output to change state only after any soft errors are resolved. Implementations of the synchronization circuit compare the outputs of two parallel synchronizers. If the two outputs are the same logic level, then the output of one of the synchronizers is provided to be the current output of the synchronization circuit. If the two outputs are different logic levels, then a previously captured output of the synchronization circuit is provided to be the current output of the synchronization circuit. Thus, implementations of the synchronizer circuit reduce or eliminate the errors in the output of the synchronization circuit caused by soft errors in the synchronizer flip-flops.

Figure 1:
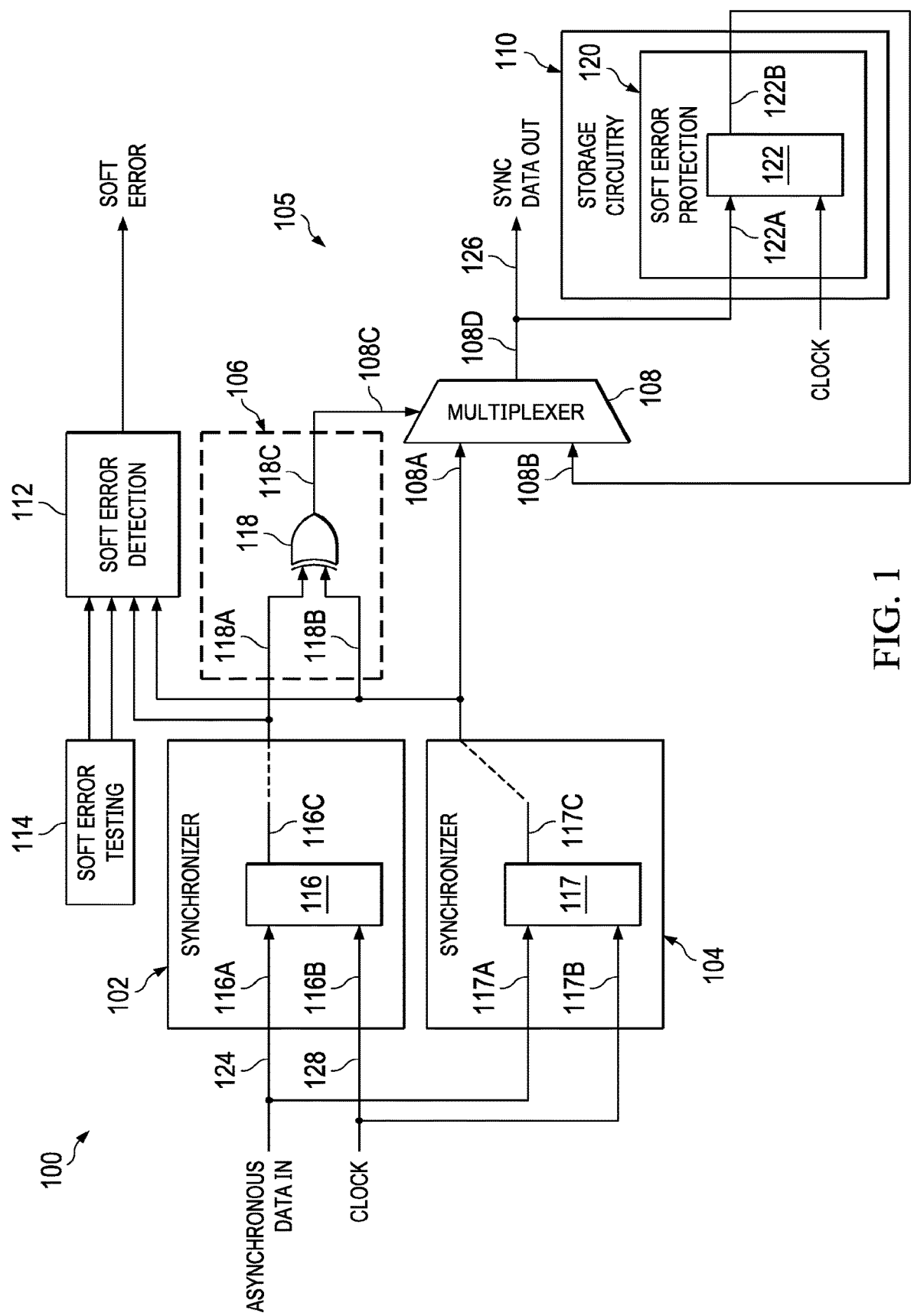
FIG. 1 shows a block diagram for an example synchronization circuit in accordance with the present disclosure.

FIG. 1 shows a block diagram for an example synchronization circuit 100 in accordance with the present disclosure. The synchronization circuit 100 includes a synchronizer 102, a synchronizer 104, and selection circuitry 105. Some implementations of the 100 also include soft error detection circuitry 112, and soft error testing circuitry 114. The synchronization circuit 100 includes an input terminal 124 for receiving an asynchronous input signal, a clock terminal 128 for receiving a synchronization clock signal; and an output terminal 126 for providing a synchronized output signal to circuitry external to the synchronization circuit 100. The input terminal 124 is coupled to the synchronizer 102 and the synchronizer 104.

The synchronizer 102 and the synchronizer 104 are connected in parallel, such that each of the synchronizer 102 and the synchronizer 104 independently synchronizes the asynchronous input signal received at the input terminal 124 to the clock signal received at the clock terminal 128. The synchronizer 102 includes one or more flip-flops 116 to synchronize the asynchronous input signal received at the input terminal 124 to the clock signal received at the clock terminal 128. The flip-flop 116 includes an input terminal 116A, a clock terminal 116B, and an output terminal 116C. The input terminal 116A is coupled to the input terminal 124, and the clock terminal 116B is coupled to the clock terminal 128. Similarly, the synchronizer 104 includes one or more flip-flops 117 to synchronize the asynchronous input signal received at the input terminal 124 to the clock signal received at the clock terminal 128. The flip-flop 117 includes an input terminal 117A, a clock terminal 117B, and an output terminal 117C. The input terminal 117A is coupled to the input terminal 124, and the clock terminal 117B is coupled to the clock terminal 128.

The selection circuitry 105 is coupled to the synchronizer 102 and the synchronizer 104. The selection circuitry 105 includes comparison circuitry 106, a multiplexer 108, and storage circuitry 110. The comparison circuitry 106 compares the output signals generated by synchronizer 102 and the synchronizer 104, and provides a result of the comparison to the multiplexer 108. In some implementations, the selection circuitry 105 may include an exclusive-OR circuit 118 (or other comparison circuitry, e.g., exclusive-NOR, etc.) that compares the output signals generated by synchronizer 102 and the synchronizer 104. Some implementations of the comparison circuitry 106 include other circuitry (e.g., exclusive-NOR circuitry) to compare the output signals generated by synchronizer 102 and the synchronizer 104. The exclusive-OR circuit 118 includes an input terminal 118A, an input terminal input terminal 118B, and an output terminal 118C. The input terminal 118A is coupled to the output terminal 116C, and the input terminal 118B is coupled to the output terminal 117C.

The multiplexer 108 includes an input terminal 108A, an input terminal 108B, a control terminal 108C, and an output terminal 108D. The control terminal 108C is coupled to the output terminal 118C, the input terminal 108A is coupled to an output of the synchronizer 102 or the synchronizer 104. The input terminal 108B is coupled to the storage circuitry 110, and the output terminal 108D is coupled to the storage circuitry 110. The multiplexer 108 routes the signal at the input terminal 108A to the output terminal 108D if the signal at the control terminal 108C indicates that the outputs of the synchronizer 102 and the synchronizer 104 are the same, and routes the signal at the input terminal 108B to the output terminal 108D if the signal at the control terminal 108C indicates that the outputs of the synchronizer 102 and the synchronizer 104 are not the same.

The storage circuitry 110 stores the synchronized output signal produced by the multiplexer 108. The storage circuitry 110 includes a flip-flop 122 or other storage circuit, and soft-error protection circuitry 120 coupled to the flip-flop 122. The flip-flop 122 includes an input terminal 122A and an output terminal 122B. The input terminal 122A is coupled to the output terminal 108D, and the output terminal 122B is coupled to the input terminal 108B. The soft-error protection circuitry 120 protects the flip-flop 122 from soft errors. For example, the soft-error protection circuitry 120 may include error correction code (ECC) circuitry that corrects the output of the flip-flop 122 if a soft error occurs in the flip-flop 122.

The synchronization circuit 100 mitigates the effects of soft errors in the synchronizer 102 and the synchronizer 104 by producing, at the output terminal 126, the output of the synchronizer 104 if the output of the synchronizer 102 is the same as the output of the synchronizer 104, and producing, at the output terminal 126, a stored prior output of the multiplexer 108 if the output of the synchronizer 102 is not the same as the output of the synchronizer 104. If a soft error changes the output of the one of the synchronizer 102 or the synchronizer 104, the selection circuitry 105 provides the stored prior output of the multiplexer 108 at the output terminal 126.

The soft error detection circuitry 112 is coupled to the synchronizer 102 and the synchronizer 104. The soft error detection circuitry 112 monitors the output of the synchronizer 102 and the synchronizer 104 to identify the presence of a soft error in the synchronizer 102 or the synchronizer 104. If the soft error detection circuitry 112 identifies a soft error in the output of the synchronizer 102 or the output of the synchronizer 104, the soft error detection circuitry 112 asserts an output to notify circuitry external to the synchronization circuit 100 of the soft error.

The soft error testing circuitry 114 is coupled to the soft error detection circuitry 112. The soft error testing circuitry 114 generates signals to test soft error detection in the soft error detection circuitry 112. The soft error testing circuitry 114 generates signal sequences that replicate the outputs of the synchronizer 102 and the synchronizer 104 when a soft error occurs in the synchronizer 102 or the synchronizer 104. The soft error detection circuitry 112 processes the signals generated by the soft error testing circuitry 114 to test soft error detection.

Figure 2:
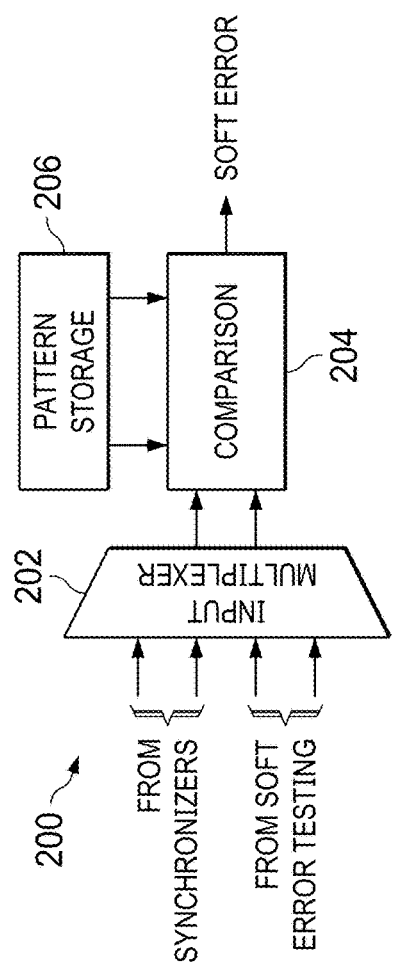
FIG. 2 shows a block diagram for an example soft error detection circuit in accordance with the present disclosure.

FIG. 2 shows a block diagram for an example soft error detection circuit 200 in accordance with the present disclosure. The soft error detection circuit 200 is an implementation of the soft error detection circuitry 112. The soft error detection circuit 200 includes an input multiplexer 202, comparison circuitry 204, and sequence storage 206.

The input multiplexer 202 selects either the outputs of the synchronizer 102 and synchronizer 104, or the output signals produced by the soft error testing circuitry 114 to process for detection of soft errors. For example, to test the soft error detection circuit 200, the input multiplexer 202 selects the output signals produced by the soft error testing circuitry 114, and in normal operating conditions the input multiplexer 202 selects the outputs of the synchronizer 102 and the synchronizer 104.

In some implementations of the soft error detection circuit 200, the sequence storage 206 stores signal sequences produced by the synchronizer 102 and synchronizer 104 when no soft error has occurred. For example, if the asynchronous input data changes from logic "0" (0) to logic "1" (1), then the signals at the output terminal 116C and the output terminal 117C will change as shown in one of Tables 1-3 below if no soft error occurs:

TABLE 1

|  | output terminal 116C | output terminal 117C |
|---|---|---|
| 1$^{st}$ clock | 0 | 0 |
| 2$^{nd}$ clock | 1 | 1 |

TABLE 2

|  | output terminal 116C | output terminal 117C |
|---|---|---|
| 1$^{st}$ clock | 0 | 0 |
| 2$^{nd}$ clock | 0 | 1 |
| 3$^{rd}$ clock | 1 | 1 |

TABLE 3

|  | output terminal 116C | output terminal 117C |
| --- | --- | --- |
| 1st clock | 0 | 0 |
| 2nd clock | 1 | 0 |
| 3rd clock | 1 | 1 |

If the asynchronous input data changes from 1 to 0, then the signals at the output terminal 116C and the output terminal 117C will change as shown in one of Tables 4-6 below if no soft error occurs:

TABLE 4

|  | output terminal 116C | output terminal 117C |
| --- | --- | --- |
| 1st clock | 1 | 1 |
| 2nd clock | 0 | 0 |

TABLE 5

|  | output terminal 116C | output terminal 117C |
| --- | --- | --- |
| 1st clock | 1 | 1 |
| 2nd clock | 1 | 0 |
| 3rd clock | 0 | 0 |

TABLE 6

|  | output terminal 116C | output terminal 117C |
| --- | --- | --- |
| 1st clock | 1 | 1 |
| 2nd clock | 0 | 1 |
| 3rd clock | 0 | 0 |

The comparison circuitry 204 may compare the data sequence received from the input multiplexer 202 to the data sequences stored in the sequence storage 206, and if the data sequence received from the input multiplexer 202 does not match one of the data sequences stored in the sequence storage 206, then the comparison circuitry 204 may indicate that a soft error has been detected.

In some implementations of the soft error detection circuit 200, the sequence storage 206 stores signal sequences produced by the synchronizer 102 and synchronizer 104 when a soft error occurs. If a soft error occurs in the synchronizer 102 or the synchronizer 104, then the signals at the output terminal 116C and the output terminal 117C may change as shown in one of Tables 7-10.

TABLE 7

|  | output terminal 116C | output terminal 117C |
| --- | --- | --- |
| 1st clock | 0 | 0 |
| 2nd clock | 0 | 1 |
| 3rd clock | 0 | 0 |

TABLE 8

|  | output terminal 116C | output terminal 117C |
| --- | --- | --- |
| 1st clock | 0 | 0 |
| 2nd clock | 1 | 0 |
| 3rd clock | 0 | 0 |

TABLE 9

|  | output terminal 116C | output terminal 117C |
| --- | --- | --- |
| 1st clock | 1 | 1 |
| 2nd clock | 0 | 1 |
| 3rd clock | 1 | 1 |

TABLE 10

|  | output terminal 116C | output terminal 117C |
| --- | --- | --- |
| 1st clock | 1 | 1 |
| 2nd clock | 1 | 0 |
| 3rd clock | 1 | 1 |

The comparison circuitry 204 may compare the data sequence received from the input multiplexer 202 to the data sequences stored in the sequence storage 206, and if the data sequence received from the input multiplexer 202 matches one of the data sequences stored in the sequence storage 206, then the comparison circuitry 204 may indicate that a soft error has been detected.

In some implementations of the soft error detection circuit 200, the comparison circuitry 204 and the sequence storage 206 may implemented in a state machine that monitors the signals received from the input multiplexer 202 for sequences that indicate the presence of a soft error.

Figure 3:
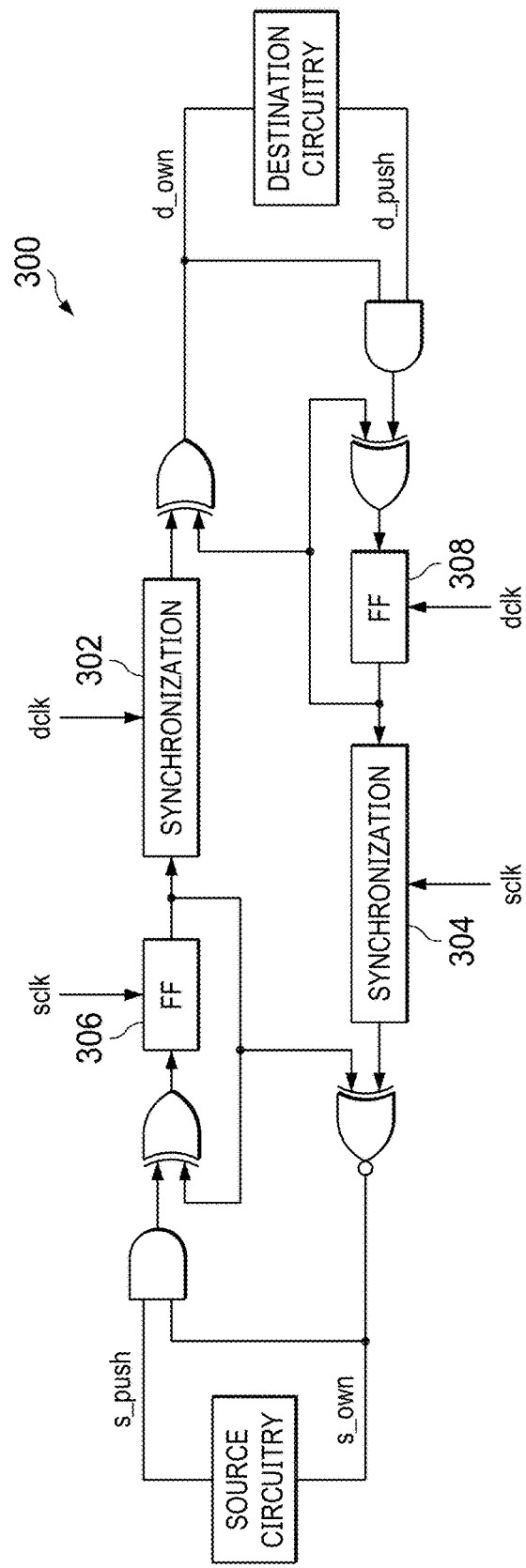
FIG. 3 shows a block diagram for an example toggle occupancy circuit that includes synchronization circuits in accordance with the present disclosure.

FIG. 3 shows a block diagram for an example toggle occupancy circuit 300 that uses synchronization circuits in accordance with the present disclosure. The toggle occupancy circuit 300 includes synchronization circuit 302 and synchronization circuit 304. The synchronization circuit 302 and the synchronization circuit 304 are implementations of the synchronization circuit 100. In the toggle occupancy circuit 300, the source circuitry issues a S_PUSH event that causes the flip-flop 306 to toggle. The flip-flop 306 may include parity or ECC circuitry that protects against soft errors. The synchronization circuit 302 synchronizes the output of the flip-flop 306 to DCLK and the destination circuitry can use data associated with the occupancy cell. When the destination circuitry issues a D PUSH event, the flip-flop 308 toggles. The flip-flop 308 may include parity or ECC circuitry that protects against soft errors. The synchronization circuit 304 synchronizes the output of the flip-flop 308 to SCLK and the source circuitry regains ownership of the occupancy cell. Use of the synchronization circuit 302 and the synchronization circuit 304 reduces or eliminates faults caused by soft errors in signal synchronization between the source and destination circuitry.

Figure 4:
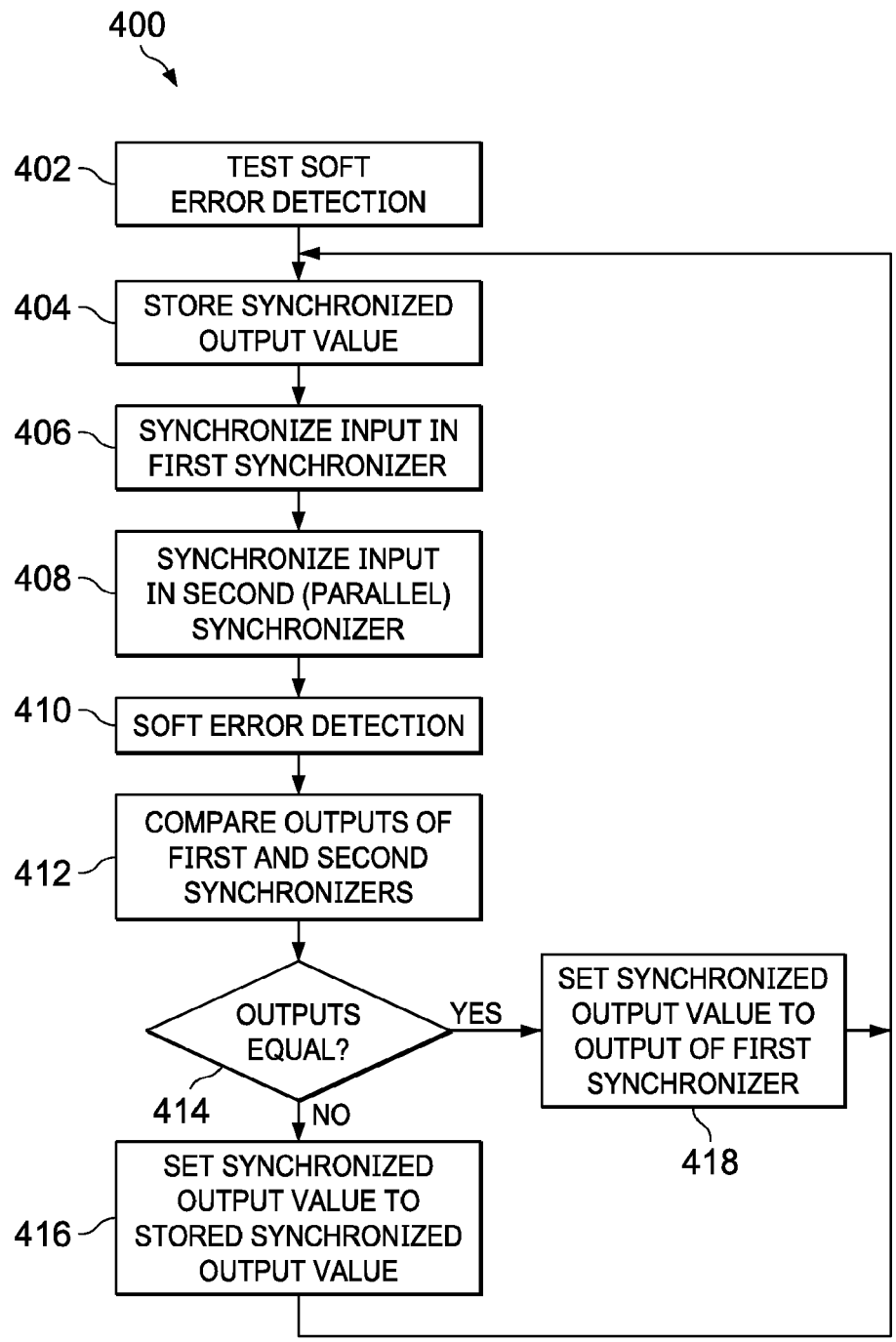
FIG. 4 shows a flow diagram for a method for synchronizing a signal in accordance with the present disclosure.

FIG. 4 shows a flow diagram for a method 400 for synchronizing a signal in accordance with the present disclosure. Though depicted sequentially as a matter of convenience, at least some of the actions shown can be performed in a different order and/or performed in parallel. Additionally, some implementations may perform only some of the actions shown.

In block 402, the soft error detection circuitry 112 is tested to ensure that the presence of soft errors in the output of the synchronizer 102 and the synchronizer 104 can be identified. Details of the testing are provided in the method 600.

In block 404, the synchronized signal value provided at the output terminal 108D of the multiplexer 108 is stored in the storage circuitry 110.

In block 406, the synchronizer 102 synchronizes the asynchronous signal received at the input terminal 124 to the clock signal received at the clock terminal 128.

In block 408, operating in parallel with the synchronizer 102, the synchronizer 104 synchronizes the asynchronous signal received at the input terminal 124 to the clock signal received at the clock terminal 128.

In block 410, the soft error testing circuitry 114 analyzes the output of the synchronizer 102 and the synchronizer 104 to determine whether a soft error has occurred in the synchronizer 102 or the synchronizer 104. Details of the soft error detection are provided in the method 500.

In block 412, the comparison circuitry 106 compares the outputs of the synchronizer 102 and synchronizer 104.

If, in block 414, the output of the synchronizer 102 is the same as the output of the synchronizer 104, then the output of one of the synchronizer 102 or the synchronizer 104 is provided as the synchronized output value at the output terminal 126 in block 418.

If, in block 414, the output of the synchronizer 102 is not the same as the output of the synchronizer 104, then the value stored in the storage circuitry 110 (i.e., a prior synchronized output value present at the output terminal 126) is provided as the synchronized output value at the output terminal 126 in block 416.

Figure 5:
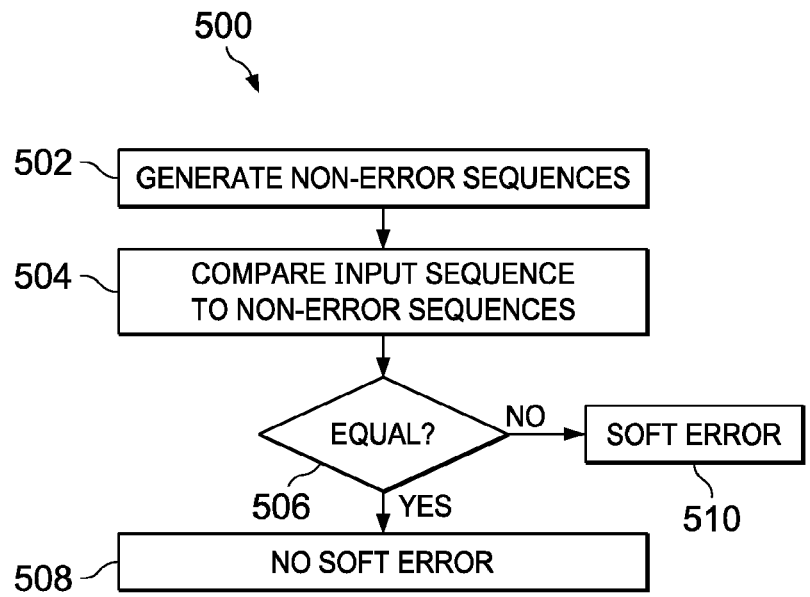
FIG. 5 shows a flow diagram for a method for detecting a soft error in a synchronizer in accordance with the present disclosure.

FIG. 5 shows a flow diagram for a method 500 for detecting a soft error in a synchronizer in accordance with the present disclosure. Though depicted sequentially as a matter of convenience, at least some of the actions shown can be performed in a different order and/or performed in parallel. Additionally, some implementations may perform only some of the actions shown.

In block 502, the sequence storage 206 generates data sequences that correspond to operation of the synchronizer 102 and the synchronizer 104 when no soft error has occurred (see Tables 1-6).

In block 504, the input multiplexer 202 is set to provide the outputs of the synchronizer 102 and the synchronizer 104 to the comparison circuitry 204. The comparison circuitry 204 compares the data sequences generated by the sequence storage 206 to the data sequences received from the synchronizer 102 and the synchronizer 104.

In block 506, if the data sequence received from the synchronizer 102 and the synchronizer 104 is same as one of the data sequences provided by the sequence storage 206, then the comparison circuitry 204 indicates that no soft error is present in block 508.

In block 506, if the data sequence received from the synchronizer 102 and the synchronizer 104 is not same as one of the data sequences provided by the sequence storage 206, then the comparison circuitry 204 indicates that a soft error is present in block 510.

Figure 6:
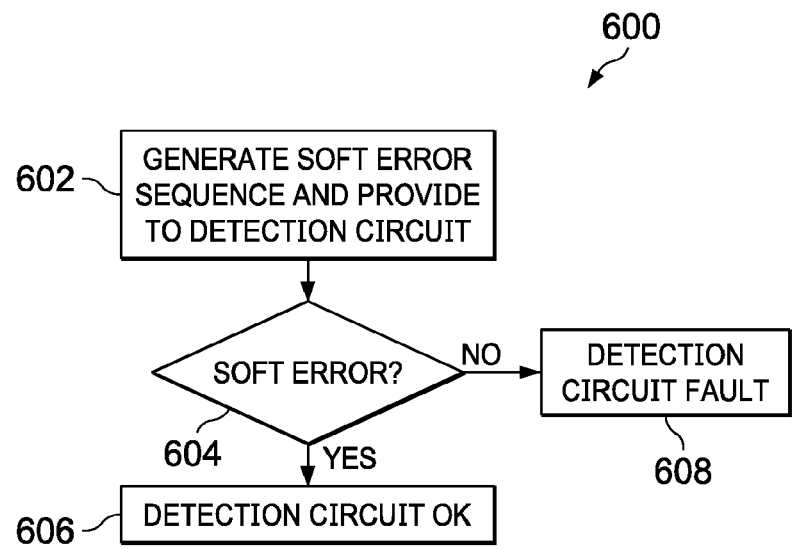
FIG. 6 shows a flow diagram for a method for testing a soft error detection circuit in accordance with the present disclosure.

FIG. 6 shows a flow diagram for a method 600 for testing a soft error detection circuit in accordance with the present disclosure. Though depicted sequentially as a matter of convenience, at least some of the actions shown can be performed in a different order and/or performed in parallel. Additionally, some implementations may perform only some of the actions shown.

In block 602, the input multiplexer 202 is set to provide the outputs of the soft error testing circuitry 114 to the comparison circuitry 204. The soft error testing circuitry 114 generates a data sequence indicative of a soft error in the synchronizer 102 or the synchronizer 104 (see Tables 7-10). The data sequence generated by the soft error testing circuitry 114 is provided to the soft error detection circuitry 112 and the comparison circuitry 204 compares the data sequence received from the soft error testing circuitry 114 to the data sequences provided by the sequence storage 206.

In block 604, if the comparison circuitry 204 indicates that a soft error is present in the data received from the soft error testing circuitry 114, then in block 606, the soft error detection circuitry 112 is operating properly.

In block 604, if the comparison circuitry 204 indicates that no soft error is present in the data received from the soft error testing circuitry 114, then in block 608, the soft error detection circuitry 112 is not operating properly.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A synchronization circuit, comprising:
   a first synchronizer having a first data input, a first clock input, and first output;
   a second synchronizer having a second data input, a second clock input, and a second output;
   selection circuitry having first, second, and third inputs, and a synchronized data output, the first and second inputs coupled to the first and second outputs, respectively;
   the selection circuitry further including storage circuitry having a storage data input coupled to the synchronized data output, a third clock input, and a feedback output coupled to an internal input of the selection circuitry.

2. The synchronization circuit of claim 1, wherein the selection circuitry includes exclusive-OR logic circuitry having the first and second inputs, and a logic output.

3. The synchronization circuit of claim 2, wherein the selection circuitry further includes multiplexing circuitry having the third input, the internal input, and the synchronized data output.

4. The synchronization circuit of claim 1, wherein the storage circuitry includes soft error protection circuitry having the storage data input, the third clock input, and the feedback output.

5. The synchronization circuit of claim 1, further comprising soft error detection circuitry coupled to the first and second outputs of the first and second synchronizers, respectively, the soft error detection circuitry having a soft error output.

6. The synchronization circuit of claim 5, further comprising test circuitry coupled to the soft error detection circuitry.

7. The synchronization circuit of claim 6, wherein the soft error detection circuitry includes an input multiplexer coupled to the first and second outputs of the first and second synchronizers, respectively, and also coupled to the testing circuitry.

8. The synchronization circuit of claim 7, wherein the soft error detection circuitry further includes comparison circuitry coupled to the input multiplexer.

9. The synchronization circuit of claim 8, wherein the soft error detection circuitry further includes sequence storage coupled to the comparison circuitry.

10. A circuit, comprising:
   source circuitry;
   first flip-flop circuitry having a first input and a first output, the first input coupled to the source circuitry;
   destination circuitry;
   second flip-flop circuitry having a second input and a second output, the second input coupled to the destination circuitry; and
   synchronization circuitry having third and fourth inputs and third and fourth outputs, the third input coupled to the first output, the fourth input coupled to the second output, the third output coupled to the destination circuitry, and the fourth output coupled to the source circuitry.

11. The circuit of claim 10, wherein the synchronization circuitry includes a first synchronization circuit having the third input and the third output, and a second synchronization circuit having the fourth input and the fourth output.

12. The circuit of claim 11, wherein each of the first and second synchronization circuits includes:
   first and second synchronizers;
   selection circuitry coupled to the first and second synchronizers, wherein the selection circuitry includes storage circuitry and a feedback loop having an output coupled to the storage circuitry.

13. The circuit of claim 11, wherein the first synchronization circuit is configured to receive a clock signal and synchronize an output signal of the first flip-flop circuitry to the clock signal.

14. The circuit of claim 11, wherein the second synchronization circuit is configured to receive a clock signal and synchronize an output signal of the second flip-flop circuitry to the clock signal.

15. The circuit of claim 11, further comprising:
   first AND logic circuitry having inputs coupled to the source circuitry and an output coupled to the first input of the first synchronization circuit; and
   second AND logic circuitry having inputs coupled to the destination circuitry and an output coupled to the second input of the second flip-flop circuitry.

16. The circuit of claim 15, further comprising:
   exclusive-OR logic circuitry having one input coupled to the output of the first AND logic circuitry, and another input coupled to the first output of the first flip-flop circuitry and the third input of the first synchronization circuit to form a first feedback loop; and
   second exclusive-OR logic circuitry having one input coupled to the output of the second AND logic circuitry, and another input coupled to the second output of the second flip-flop circuitry and the fourth input of the second synchronization circuit to form a second feedback loop.

17. The circuit of claim 16, further comprising:
   exclusive-NOR logic circuitry having one input coupled to the fourth output of the second synchronization circuit and another input coupled to the first feedback loop.

18. The circuit of claim 17, further comprising:
   third exclusive-OR logic circuitry having one input coupled to the third output of the first synchronization circuit and another input coupled to the second feedback loop.

* * * * *